United States Patent [19]

Proebsting

[11] 4,360,901
[45] Nov. 23, 1982

[54] DECODER CIRCUIT FOR SEMICONDUCTOR MEMORY

[75] Inventor: Robert J. Proebsting, Dallas, Tex.

[73] Assignee: Mostek Corporation, Carrollton, Tex.

[21] Appl. No.: 227,053

[22] PCT Filed: Jun. 2, 1980

[86] PCT No.: PCT/US80/00670
§ 371 Date: Jun. 2, 1980
§ 102(e) Date: Jun. 2, 1980

[87] PCT Pub. No.: WO81/03573
PCT Pub. Date: Dec. 10, 1981

[51] Int. Cl.³ ............................................ G11C 13/00
[52] U.S. Cl. .................................... 365/189; 365/203
[58] Field of Search ............... 365/174, 182, 189, 203, 365/230

[56] References Cited

U.S. PATENT DOCUMENTS 3,969,706 7/1976 Proebsting et al. ................. 365/189
4,081,701 3/1978 White et al. ......................... 307/355
4,082,966 4/1978 Lou ..................................... 365/174
4,156,938 5/1979 Proebsting et al. ................. 365/189

Primary Examiner—Terrell W. Fears

[57] ABSTRACT

A decoder circuit (66) includes a plurality of input transistors (78-86) connected to address lines (68-76). The drain terminals of the input transistors (78-86) are connected to a first power terminal and the source terminals thereof are connected to a first node (92) which is charged to low voltage state upon receipt of a precharge signal at a transistor (94). An address enable signal (58) operates a transistor (96) to connect node (92) to node (98) during receipt of the address. A node (102) is charged to a high state by operation of a transistor (100) in response to a precharge signal (56). Node (102) is discharged through a transistor (104) when a high voltage state is present at the node (98). An enable clock signal (52) is transmitted through a transistor (106) to a row line (108) when a high voltage state is present on node (102).

18 Claims, 4 Drawing Figures

DECODER CIRCUIT FOR SEMICONDUCTOR MEMORY

TECHNICAL FIELD

The present invention pertains to electronic logic circuits and in particular to such a circuit which is used as a decoder in a semiconductor memory.

BACKGROUND ART

In semiconductor memories an address for a memory cell is received as bi-level signals on a plurality of address lines. These binary address signals must be decoded in order to access a particular row and a particular column within the memory. A decoder is functionally a NOR circuit which generates an output on a selected row or column line with the address signal providing the inputs to the NOR circuit Various control signals are frequently applied to control the NOR circuit so that the proper address signals are received and the output is sequenced to occur at the proper time.

The decoder circuits heretofore used in semiconductor memories have functional adequately for relatively small memory sizes which operate at moderate speeds and powers. But new circuit techniques such as sharing both row and column addresses on the same lines and transmitting these to a row decoder at different times together with bootstrapping of a selected row line above the supply voltage have added new constraints to the design of a row decoder.

DISCLOSURE OF THE INVENTION

A row decoder circuit is disclosed which charges a row line in a semiconductor memory where the row line is selected by a multi-bit memory address. The decoder circuit includes a dynamic OR gate having a plurality of input terminals and an output terminal. Each of the input terminals is connected to receive a respective bit of the address. The input terminal of a dynamic inverter is connected to the output terminal of the OR gate. A row driver transistor is connected to the output terminal of the inverter and to the row line. The voltage state on the output terminal of the inverter determines the conductivity of the row driver transistor which supplies a row enable signal to the row line.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

Figure 1:
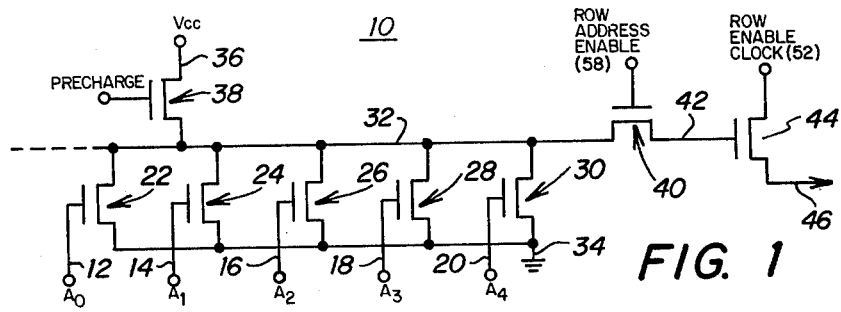
FIG. 1 is a schematic illustration of a decoder circuit heretofore used in semiconductor memories.

A typical decoder circuit as heretofore used in semiconductor memories is illustrated in FIG. 1. Decoder circuit 10 has a plurality of input address lines including 12–20. Address bits $A_0$, $A_1$, $A_2$, $A_3$ and $A_4$ are transmitted respectively through the address lines 12–20. Each separate decoder circuit has its unique combination of true and complement address bits, with either the true or complement of each address bit going to each decoder. A particular memory address for a row or column line is a collection of high and low voltage levels on the address lines. The address lines 12–20 are connected respectively to the gate terminal of input transistors 23–30. The drain terminals of each of the input transistors is connected to a common node 32 and the source terminals of each of the input transistors is connected to a common node 34 which serves as the circuit ground. The power for circuit 10 is supplied through a power terminal 36 which is connected to the supply voltage $V_{cc}$ The voltage $V_{cc}$ is typically 5.0 volts.

Circuit 10 includes a transistor 38 which has the drain terminal thereof connected to power terminal 36 for receiving voltage $V_{cc}$. The source terminal of transistor 38 is connected to node 32. The gate terminal of transistor 38 is connected to receive a precharge signal which is illustrated in FIG. 2.

Circuit 10 further includes a transistor 40 which has the drain and source terminals thereof connected between node 32 and a node 42. The gate terminal of transistor 40 is connected to receive a row address enable signal which is shown in FIG. 2.

Figure 2:
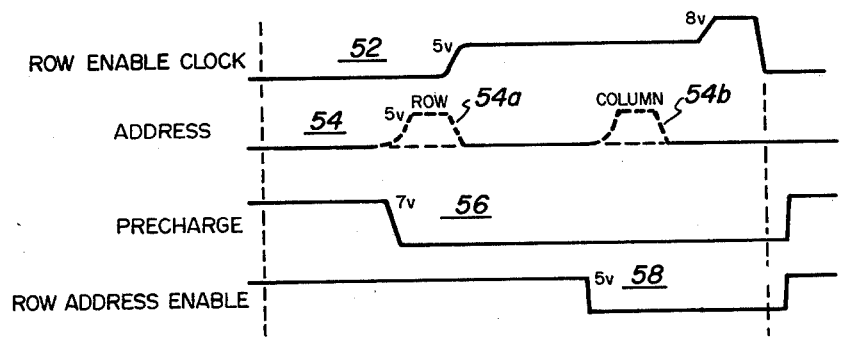
FIG. 2 is a illustration of various control signals which drive the decoder NOR circuits described herein.

Circuit 10 further includes a transistor 44 which has the gate terminal thereof connected to node 42 and the drain terminal thereof connected to receive a row enable clock signal which is shown in FIG. 2. The source terminal of transistor 44 is connected to gate the row enable clock signal to a row line 46.

The various control signals and timing signals utilized to sequence the operation of the circuits described herein are illustrated in FIG. 2. A row enable clock signal 52 has an initial low state followed by a step to a 5.0 volt state followed by a brief elevation to an 8.0 volt state and then a return to ground potential. Signal 52 serves as an enable signal to activate a row line. The address data is transmitted over lines $A_0$–$A_4$ as shown in signal 54 where the row addresses are transmitted as low or high levels at row time 54a and the column addresses are transmitted at the column time 54b. A precharge signal 56 starts at an initial high level of 7.0 volts and drops directly to a ground potential for the remainder of the active portion of the cycle, returning to 7.0 volts thereafter in preparation for a new cycle. A row address enable signal 58 has a high level except in the period 54b when the column addresses are being transmitted through the address lines. The signals shown in FIG. 2 are supplied by external circuits not shown.

It is understood that the row lines described herein can be either word lines or bit lines in a semiconductor memory.

Referring to FIGS. 1 and 2, a conventional row decoder circuit operates as follows. At the start of an address sequence, the address lines 12–20 are held at ground level thereby turning off transistors 22–30. The precharge signal 56 turns on transistor 38 which pulls node 32 to a high level. The precharge signal 56 then transitions from high to low thereby turning transistor 38 off, but leaving node 32 charged to approximately the potential of $V_{cc}$. The row address signals are then applied to the address lines 12–20 and if any one or more of the address lines is driven to a high level, the input transistors 22–30 corresponding thereto will be turned on, thereby discharging node 32 to ground. The circuit is selected if all of the inputs are low and is not selected if any of the inputs is high. During the time that the row addresses are received, the row address enable signal 58 is at a high level, therefore coupling node 32 to node 42. Node 42 is therefore established at the same voltage state as node 32. If node 42 has been left at a high state, the circuit 10 being selected, transistor 44, will be turned on thereby gating the row enable clock signal 52 to the row line 46. If the circuit 10 has not been selected, node 42 will be at a low level, thereby holding transistor 44 turned off and substantially blocking the row enable clock signal from being coupled to the row line 46.

Although circuit 10 has been used extensively, it does suffer serious drawbacks in newer applications in which there is sharing of row and column address data on the same lines at different times to a row decoder and in which the row line is bootstrapped above the supply voltage.

Transistor 40 is included in circuit 10 to isolate the column address which is transmitted over the same lines as the row address. The row address enable signal 58 goes to a low level to open transistor 40 before column addresses are supplied over lines 12–20. While transistor 40 is turned off, node 42 is isolated late in the cycle when the row enable clock signal 52 goes from 5 to 8 volts. The increase in voltage at the drain terminal of transistor 44 is capacitively coupled to node 42, which can turn on transistor 44 to at least a slight extent, thereby coupling a signal into an unselected row line 46. This is unintended operation of the circuit and the coupling of such a signal to line 46 at the wrong time causes data in the memory cells along that row line to be destroyed. Therefore, the decoder circuit 10 cannot work well with a semiconductor memory in which a row enable clock signal 52 is bootstrapped to a high voltage level after the column addresses have been received on the address lines.

In a row decoder, the source terminal of transistor 44 is connected to a row line which has connected to it a great number of memory cells. In a 64K memory, there normally will be 256 memory cells connected to row line 46. This number of memory cells constitute a substantial cpacitance which is connected to line 46. In order to charge this capacitance, transistor 44 must be a relatively large device as compared to the remainder of the transistors used in a memory circuit. A typical channel width for transistor 44 is 50–100 microns. A transistor of this size has a substantial gate capacitance and this capacitance must be discharge each time any one of the input transistors 22–30 is turned on. Therefore, each of the transistors 22–30 must be of sufficient size to rapidly discharge the capacitance from the gate terminal of transistor 44 upon receipt of a high level through any of the address lines. Each of the transistors 22–30 must have a channel width on the order of 20 microns to perform this job with sufficient speed. Transistors of this size are also relatively large. Input transistors of this size with the source at ground require a substantial current through the address lines in order to charge up the gate capacitance and turn on the transistor. It is therefore desirable to make the input transistors as small as possible in order to reduce power consumption by the semiconductor memory and to increase operating speed.

A further problem of circuit 10, in which column addresses are received on the same lines with the row addresses, is that upon receipt of column addresses the row decoder transistors present a high capacitance loading to the address lines. This is a direct result of the source terminals being at ground and the need for these input transistors to be relatively large to discharge the pass transistor 44 quickly.

Figure 3:
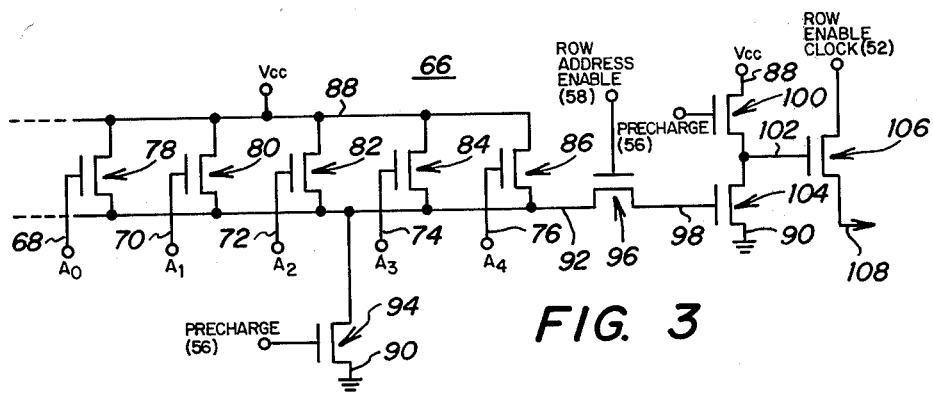
FIG. 3 is a schematic illustration of the decoder circuit of the present invention.

In FIG. 3, there is illustrated the decoder circuit of the present invention which resolves the problems illustrated above for a conventional decoder circuit. Decoder circuit 66 in FIG. 3 has a plurality of input address lines 68–76 which receive row and column address signals. As above, the address information is designated as $A_0$, $A_1$, $A_2$, $A_3$ and $A_4$. The address lines 68–76 are connected respectively to the gate terminals of input transistors 78–86. Five input transistors are shon in circuit 66, however, the number actually implemented in the circuit is dependent upon the number of bits in the row and column addresses. The drain terminals of the input transistors 78–86 are connected to the positive supply terminal 88 which supplies the voltage $V_{cc}$ to the circuit. The circuit ground is provided through a terminal 90. The source terminals of each of the input transistors 78–86 are connected to a node 92.

The input transistors 78–86 and the precharge transistor 94 function as a dynamic OR gate. A dynamic circuit is one in which there is no DC current path set up between the power terminals which, in FIG. 3, are terminals 88 and 90. A dynamic circuit has extremely low DC power consumption.

Circuit 66 includes a transistor 94 having the drain terminal thereof connected to node 92 and the source terminal thereof connected to the ground terminal 90. The gate terminal of transistor 94 is connected to receive the precharge signal 56 illustrated in FIG. 2.

The row address enable signal 58 is transmitted to the gate terminal of a pass transistor 96 which has the drain and source terminals thereof connected between node 92 and a node 98.

The precharge signal 56 is also supplied to the gate terminal of a transistor 100. The drain terminal of transistor 100 is connected to the power supply terminal 88 to receive the voltage $V_{cc}$ and the source terminal thereof is connected to a node 102.

A transistor 104 has the gate terminal thereof connected to node 98, the drain terminal thereof connected to node 102 and the source terminal thereof connected to the common ground terminal 90. Transistor 104 functions as an inverter.

The combination of transistor 100 and transistor 104 is a dynamic inverter in which there is not set up a DC path from $V_{cc}$ to ground.

A row driver transistor 106 in circuit 66 has the drain terminal thereof connected to receive the row enable clock signal 52. The gate terminal of transistor 106 is connected to node 102 and the source terminal is connected to a row line 108 through which the row enable signal is gated to a row line in a semiconductor memory array.

Operation of the improved row decoder circuit of the present invention is now described in reference to FIGS. 2 and 3. During each address cycle, the circuit goes through the following sequence of operation. Initially, the precharge signal 66 turns on transistor 94 thereby pulling node 92 to a low state, ground potential. During this time all of the address lines are held at ground. Node 92 is isolated when transistor 94 turns off thereby leaving node 92 floating at ground potential. The row address enable signal 58 is at a high voltage state at this time causing node 98 to follow 92 to ground.

This turns off transistor 104. The precharge signal 56 also turns on transistor 100, which precharges node 102 to a high potential. Transistor 100 likewise turns off when signal 56 transitions from high to low, leaving node 102 floating and charged to the high potential.

The address lines 68-76 stay at a low level at all times when addresses are not being transmitted therethrough. The circuit 66 is selected when the row address is transmitted through lines 68-76 and none of the address lines for that particular decoder transistion from a low to a high level. At the time that the row address is received, transistor 96 is still turned on, thereby coupling node 92 to node 98. If circuit 66 is selected, node 98 will likewise remain at a low potential. The low potential on node 98 turns off transistor 104, thereby maintaining the high potential on node 102. The high voltage charge which had been isolated on node 102 maintains transistor 106 conductive which couples the row enable clock signal 52 to the row line 108. At the time that the row enable clock signal 52 transitions from the 5 to the 8 volt level, the increase in voltage will be capacitively coupled from the drain terminal of transistor 106 to the gate terminal, thereby increasing the gate voltage and increasing the voltage on the row line 108. It is desired to apply such an increased voltage on the row line 108 in order to apply a higher bias to the access transistors in the memory circuit so that a full $V_{cc}$ voltage can be applied to the storage capacitors. Before the column addresses are received, the transistor 96 is turned off, thereby isolating node 92 from node 98. When the column addresses are received on lines 68-76, any effects thereof are not propagated from node 92 to node 98, thereby there is no effect on the row line 108 upon receipt of the column addresses.

When circuit 66 is not selected, a high level will be applied on one or more of the input address lines 68-76. A high level on an address line turns on the corresponding input transistor, thereby causing node 92 to be charged to a high potential. Note that when an address signal is received, transistor 94 is turned off so that node 92 can be rapidly charged. At this time, transistor 96 is conductive thereby coupling node 92 to node 98 and pulling node 98 to a high level as well. The high potential on node 98 turns on transistor 104 thereby discharging node 102 through transistor 104. Node 102 is thus left at a ground potential. The low potential on node 102 turns transistor 106 off, thereby preventing the transfer of the row enable clock signal 52 from the drain terminal of transistor 106 to the row line 108. In this case, the row line 108 has not been selected and the access transistors along this line will not be activated.

After the row address has been received, but before the column address is received, transistor 96 will be turned off by the row address enable signal 58, thereby isolating node 92 from node 98. The high level trapped on node 98 maintains transistor 104 conductive to hold node 102 at ground potential. This prevents any effect of the column address from being propagated to the row line 108.

As noted above, the transistor 106, which corresponds to transistor 44, must be a relatively large device in order the handle the heavy capacitive load on the row line when it is a part of a large capacity semiconductor memory. Likewise, the gate terminal of transistor 106 also has substantial capacitance which must be discharged each time transistor 106 is turned on. In the present invention, the capacitance of the gate terminal of transistor 106 is discharged by transistor 104. Transistor 104 is thus fabricated to have a size sufficient to discharge the capacitance of node 102 with the desired speed. Transistor 104 is approximately the same size as each of the input transistors 22-30 illustrated in FIG. 1. The gate capacitance of transistor 104 will, however, be substantially less than that of transistor 106. Therefore, the input transistors 78-86 need to be only a fraction of the size of the transistor 104. Thus, the input transistors in the present invention, transistors 78-86, can be fabricated to have a much narrower channel width than the input transistors for the circuit 10 shown in FIG. 1.

Typical fabrication dimensions for the channel widths of the relevant transistors shown in FIG. 3 are 50-100 microns for transistor 106, 20 microns for transistor 104 and 5 microns for transistors 78-86. Since in a large capacity semiconductor memory circuit there will be a substantial number of input transistors, it can readily be seen the circuit of the present invention occupies substantially lesser space than the circuit 10 illustrated in FIG. 1. Further, the reduced capacitance on the input transistors due to their lesser size reduces the amount of power required to be transmitted through the address lines in order to turn these transistors on and off, thereby reducing the power consumption of the circuit and increasing the speed of operation.

The problem of coupling the elevated voltage portion of the row enable clock signal 52 into the unselected row line 46 in circuit 10 is eliminated in circuit 66. When the row address enable signal 58 goes to a low level, the high potential is trapped on node 98 which is then floating. This high potential serves to keep transistor 104 turned on. In this condition, node 102 is actively pulled to ground, rather than floating, which is the case for node 42 discussed above for circuit 10. Thus, when the row enable clock signal 52 transitions from the 5 to the 8 volt level, the capacitive coupling from the drain to the gate terminals of transistor 106 will be discharged through transistor 104, thus not permitting the voltage on node 102 to rise to a sufficient level to turn on transistor 106. This effectively prevents any signal from being coupled between the drain and source terminals of transistor 106 other than when row line 108 has been selected by the row address signal.

A further advantage of circuit 66 over circuit 10 is the reduced effective capacitance of the input transistors due to the relative states of the input signal and internal nodes. In circuit 10, the drain terminals of the input transistors are precharged to a high level. When a high level is received on an address line at the gate terminal of an input transistor, the drain terminal of that input transistor will be driven to a low state thus producing a voltage differential between the gate and drain terminals. By driving these terminals to opposite voltage states, the full capacitance between the gate and drain terminals must be charged each time a high level is received on an address line. This capacitance consumes power and reduces the speed of operation of the input transistors.

In the circuit 66 of the present invention, the source terminals of the input transistors are initially charged to a low state and are pulled to a high state when a high level is received on an address line. The gate and source terminals of the input transistors are each driven to a high level which substantially reduces the capacitive load at the gate terminals since there is no voltage differential between the transistor gate and source terminals. Thus, the address signals work into a reduced capacitance with the decoder circuit of the present invention which in turn reduces power consumption and increases operating speed.

It can therefore be seen that the decoder circuit 66 of the present invention offers substantial advantages over the decoder circuit 10 heretofore in use.

The present invention has been primarily described in reference to use as a row decoder in a semiconductor memory, however, it can function equally well as a column decoder for activating column lines in a semiconductor memory. When used as a column decoder, a column enable clock signal is used in place of the row enable clock signal 52. The row line described herein can be either a word line or a bit line in a semiconductor memory.

Figure 4:
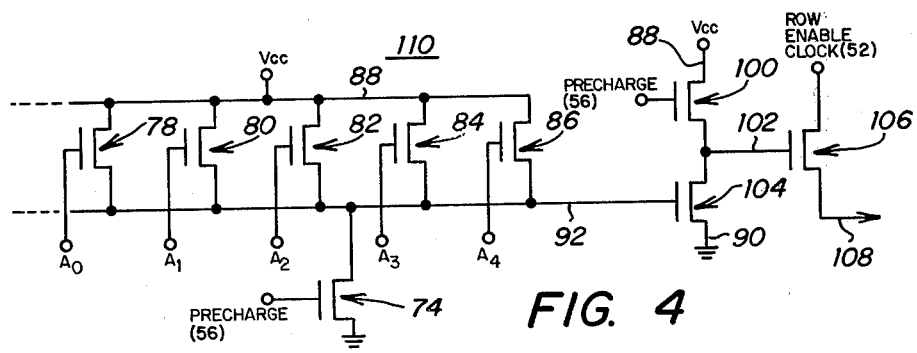
FIG. 4 is a schematic illustration of an alternative embodiment of the decoder circuit of the present invention.

An alternative embodiment of the present invention is illustrated in FIG. 4. This circuit in FIG. 4 corresponds to that shown in FIG. 3 but with the exception that transistor 96 is deleted and replaced with a direct connection between nodes 92 and 98. Although this circuit does not have the protective feature than eliminates the coupling of elevated voltages supplied on the row enables clock line into the control line 108, in certain types of semiconductor memories such a signal is not required. In these applications the circuit 110 still provides all the other advantages listed above for the circuit of the present invention.

In each of the circuits described herein where a precharge signal is supplied to the gate terminal of a transistor which has the drain terminal connected to $V_{cc}$, the precharge signal P can optionally be a constant high level signal at approximately $V_{cc}$ rather than a bi-level signal as described and shown herein. A circuit using a constant high level precharge signal, however, consumes more power than does a circuit which uses a bi-level precharge signal.

Although several embodiments of the invention have been illustrated in the accompanying drawings and described in the foregoing Detailed Description, it will be understood that the invention is not limited to the embodiments disclosed, but is capable of numerous rearrangements, modifications and substitutions without departing from the scope of the invention.

I claim:

1. In a semiconductor memory, a decoder circuit for charging a row line selected by a multi-bit memory address, the decoder comprising:
   an OR gate having a plurality of input terminals, and an output terminal each input terminal connected to receive a respective bit of said address;
   an inverter having an input terminal connected to the output terminal of said OR gate, said inverter also having an output terminal; and
   a row driver transistor connected to the output terminal of said inverter and to said row line where the voltage state on the output terminal of said inverter determines the conductivity of said row driver transistor.

2. The decoder circuit recited in claim 1 wherein said OR gate is a dynamic circuit.

3. The decoder recited in claim 1 wherein said inverter is a dynamic circuit.

4. The decoder circuit recited in claim 1 wherein said decoder circuit and said inverter are dynamic circuits.

5. A decoder circuit for transmitting a row enable signal to a row line of a semiconductor memory in response to receipt of a row address signal which is transmitted through a plurality of address lines as first and second voltage states, the circuit functioning during each memory cycle in response to at least one precharge signal followed by an address enable signal, the decoder circuit, comprising:
   means for precharging a first node to said second state in response to said precharge signal;
   means for driving said first node to said first state upon receipt of said address signal when said received address signal has said first state on at least one of said address lines;
   means for connecting said first node to a second node in response to said address enable signal during receipt of said address signal, said second node receiving the state of said first node, and for disconnecting said first node from said second node after receipt of said row address signal to trap the state of said second node thereon;
   means for precharging a third node to said first state in response to a precharge signal;
   means for driving said third node to said second state when said first state is trapped on said second node and for maintaining said first state on said third node when said second state is trapped on said second node; and
   means for transmitting said row enable signal to said row line when said third node is at said first state.

6. A decoder circuit for transmitting a row enable signal to activate a row line of a semiconductor memory in response to an address supplied through a plurality of address lines, the decoder circuit functioning in response to at least one precharge signal and an address enable signal, the circuit powered through first and second power terminals, comprising:
   a plurality of input transistors having the drain terminals thereof connected to said first power terminal, the source terminals thereof connected to a first node and each gate terminal thereof connected to a respective one of said address lines;
   a first transistor having the drain terminal thereof connected to said first node, the source terminal thereof connected to said second power terminal and the gate terminal thereof connected to receive a precharge signal;
   a second transistor having a first of the drain and source terminals thereof connected to said first node and the remaining one of the drain and source terminals thereof connected to a second node and the gate terminal thereof connected to receive said address enable signal;
   a third transistor having the drain terminal thereof connected to a third node, the source terminal thereof connected to said second power terminal and the gate terminal thereof connected to said second node;
   a fourth transistor having the drain terminal thereof connected to said first power terminal, the source terminal thereof connected to said third node and the gate terminal thereof connected to receive a precharge signal; and a fifth transistor having the drain terminal thereof connected to receive said row enable signal, the source terminal thereof connected to said row line and the gate terminal thereof connected to said third node.

7. The decoder circuit recited in claim 6 wherein said circuit is fabricated as a MOSFET integrated circuit and the channel width of said third transistor is greater than the channel width of said input transistors.

8. The decoder circuit recited in claim 7 wherein the channel width of said fifth transistor is greater than the channel width of said third transistor.

9. The decoder circuit recited in claim 7 wherein the ratios of the channel widths of said input, said third and said fifth transistor respectively are approximately 1:4:10.

10. A decoder circuit for transmitting a row enable signal to activate a row line of a semiconductor memory in response to an address supplied through a plurality of address lines, the decoder circuit functioning in response to at least one precharge signal, the decoder circuit powered through first and second power terminals, comprising:
 a plurality of input transistors having the drain terminals thereof connected to said first power terminal, the source terminals thereof connected to a first node and each gate terminal thereof connected to a respective one of said address lines;
 a first transistor having the drain terminal thereof connected to said first node, the source terminal thereof connected to said second power terminal and the gate terminal thereof connected to receive said precharge signal;
 a second transistor having the drain terminal thereof connected to a second node, the source terminal thereof connected to said second power terminal and the gate terminal thereof connected to said first node;
 a third transistor having the drain terminal thereof connected to said first power terminal, the source terminal thereof connected to said second node and the gate terminal thereof connected to receive a precharge signal; and
 a fourth transistor having the drain terminal thereof connected to receive said row enable signal, the source terminal thereof connected to said row line and the gate terminal thereof connected to said second node.

11. The decoder circuit recited in claim 10 wherein said circuit is fabricated as a MOSFET integrated circuit and the channel width of said second transistor is greater than the channel width of said input transistors.

12. The decoder circuit recited in claim 11 wherein the channel width of said fourth transistor is greater than the channel width of said second transistor.

13. The decoder circuit recited in claim 11 wherein the ratios of the channel widths of said input, said second and said fourth transistors respectively are approximately 1:4:10.

14. A method for decoding multi-bit address data in a semiconductor memory having row and column lines, the method comprising the steps of:
 transmitting row selection address bits through a group of address lines to an OR gate, each of said address lines connected to a respective input terminal of said OR gate;
 generating a first state at the output terminal of said OR gate when said OR gate is selected by the address bits received at the input terminals thereof;
 transmitting column selection address bits through said address lines after transmission of said row selection address bits therethrough; and
 inhibiting the output signal from said OR gate from changing state at the time of receipt of said column selection address bits at the input terminals of said OR gate.

15. The method recited in claim 14 including the step of transmitting the output of said OR gate through an inverter.

16. A method for decoding a row address signal to select a row line in a semiconductor memory where the address signal is transmitted through address lines and is valid for a limited time period, comprising the steps of:
 precharging the output terminal of an OR gate such that the output signal from said OR gate is at a first state,
 transmitting said address signal through said address lines to respective input terminals of said OR gate;
 holding the output signal from said OR gate at said first state when said OR gate is selected by said address signal;
 driving said output signal of said OR gate to a second state when said OR gate is not selected by said address signal,
 gating the output signal of said OR gate through a pass transistor which is rendered conductive during said time period for transmitting the output signal of said OR gate to the input terminal of an inverter;
 driving said pass transistor nonconductive after receipt of said address bits at the input terminals of said OR gate to trap the state of the output signal of said OR gate on the input terminal of said inverter; and
 coupling the output signal from said inverter to a row driver transistor for controlling the conductivity thereof, said row driver transistor connected to said row line.

17. A method for decoding a row address signal to select a row line in a semiconductor memory where the address signal is transmitted through address lines and is valid for a limited time period, comprising the steps of:
 precharging the output terminal of a dynamic OR gate such that the output signal from said OR gate is at a first state,
 transmitting said address signal through said address lines to respective input terminals of said dynamic OR gate;
 holding the output signal from said OR gate at said first state when said dynamic OR gate is selected by said address signal;
 driving said output signal of said dynamic OR gate to a second state when said dynamic OR gate is not selected by said address signal,
 gating the output signal of said OR gate through a pass transistor which is rendered conductive during said time period for transmitting the output signal of said dynamic OR gate to the input terminal of a dynamic inverter;
 driving said pass transistor nonconductive after receipt of said address bits at the input terminal of said dynamic OR gate to trap the state of the output signal of said OR gate on the input terminal of said inverter; and
 coupling the output signal from said inverter to a row driver transistor for controlling the conductivity thereof, said row driver transistor connected to said row line.

18. A method for transmitting a row enable signal to a row line of a semiconductor memory in response to receipt of a row address signal which is transmitted through a plurality of address lines as first and second voltage states, the method operating in response to a precharge signal and a row address enable signal, comprising the steps of:

precharging a first node to said second state;

driving said first node to said first state upon receipt of said first state or any one of said address lines;

connecting said first node to a second node in response to said row address enable signal, said second node charged to the state of said first node, and for disconnecting said first node from said second node after receipt of said row address signal to trap the state of said second node thereon;

precharging a third node to said first state in response to a precharge signal;

driving said third node to said second state when said first state is trapped on said second node and maintaining said third node at said first state when said second state is trapped on said second node; and transmitting said row enable signal to said row line when said third node is at said first state.

* * * * *